US 6,627,555 B2

(12) United States Patent
Eitan et al.

(10) Patent No.: US 6,627,555 B2
(45) Date of Patent: Sep. 30, 2003

(54) METHOD AND CIRCUIT FOR MINIMIZING THE CHARGING EFFECT DURING MANUFACTURE OF SEMICONDUCTOR DEVICES

(75) Inventors: Boaz Eitan, Ra'anana (IL); Ilan Bloom, Haifa (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 09/777,234

(22) Filed: Feb. 5, 2001

(65) Prior Publication Data

US 2001/0026970 A1 Oct. 4, 2001

Related U.S. Application Data

(62) Division of application No. 09/336,666, filed on Jun. 18, 1999, now Pat. No. 6,337,502.

(51) Int. Cl.⁷ .................. H01L 21/98; H01L 21/3065; H01L 21/302
(52) U.S. Cl. .................. 438/710; 257/356; 505/411; 438/709; 438/9; 216/67
(58) Field of Search .................. 257/357–358, 257/393, 411; 438/778, 787, 791, 709, 7–9; 505/411; 216/67

(56) References Cited

U.S. PATENT DOCUMENTS

| 4,941,028 A | 7/1990 | Chen et al. | |
|---|---|---|---|
| 5,350,710 A | 9/1994 | Hong et al. | |
| 5,393,701 A | * 2/1995 | Ko et al. | 437/193 |
| 5,760,445 A | 6/1998 | Diaz | |
| 5,903,031 A | 5/1999 | Yamada et al. | |
| 5,963,412 A | * 10/1999 | En | 361/111 |
| 6,028,324 A | 2/2000 | Su et al. | |
| 6,117,714 A | * 9/2000 | Beatty | 438/196 |
| 6,154,081 A | * 11/2000 | Pakkala et al. | 327/309 |

FOREIGN PATENT DOCUMENTS

| EP | 693781 | 7/1994 |
|---|---|---|
| WO | WO 9615553 | 5/1996 |

* cited by examiner

*Primary Examiner*—Matthew Smith
*Assistant Examiner*—Calvin Lee
(74) *Attorney, Agent, or Firm*—Eitan, Pearl, Latzer & Cohen Zedek, LLP

(57) ABSTRACT

A protection device which is active during the manufacturing process of a semiconductor chip includes a protection transistor and an antenna. The protection transistor is connected between a metal line having devices to be protected electrically connected thereto and a ground supply, where the metal line is connected to devices to be protected. The antenna is formed of the same metal layer as the metal line and controls the operation of the protection transistor during the manufacturing process. The antenna is connected to a gate of the protection transistor. Optically, there is a metal ring around the antenna which is connected to a drain of the protection transistor via the same metal layer as the metal line. During normal operation of the chip, the protection transistor is either active for other purposes or is turned off. Turning off is provided either by a line formed of a second metal layer that is connected between the antenna and ground, or by a reversed biased diode and a parallel capacitor that are connected between the gate of the protection transistor and ground. The present invention includes the method of manufacturing the protection device.

9 Claims, 11 Drawing Sheets

METHOD AND CIRCUIT FOR MINIMIZING THE CHARGING EFFECT DURING MANUFACTURE OF SEMICONDUCTOR DEVICES

This is a division, of application Ser. No. 9/336,666, filed Jun. 18, 1999 now U.S. Pat. No. 6,337,502. Each of these prior applications is hereby incorporated herein by reference, in its entirety.

FIELD OF THE INVENTION

The present invention relates to the manufacture of semiconductor products in general.

BACKGROUND OF THE INVENTION

During the manufacture of semiconductor products, layers of material are laid down or grown. Some layers are then etched, to produce the desired shapes of transistors, metal lines, and other microelectronics devices. When the processing has finished, a functioning chip is produced. If the chip contains a memory array, it will have a plurality of memory transistors which can be programmed to store charge (and, possibly, erased also). For example, the memory transistors might be floating gate transistors, nitride read only memory (NROM) transistors, silicon oxide-nitride oxide-silicon (SONOS) transistors and all other non-volatile memory metal oxide semiconductor (MOS) devices that can store charge.

Unfortunately, the manufacturing process can have some undesired side effects. For example, in MOS technology, the charging of active elements during the manufacturing process may alter the device's characteristics or even damage them.

FIG. 1, to which reference is now made, shows a typical cross-section of an MOS or complementary MOS (CMOS) transistor. It is typically formed of a gate oxide 10 over which is a polysilicon element 12. On either side of the gate oxide 10 are field oxides 14 which are much thicker than the gate oxide 10. Typically, the polysilicon element 12 also spreads over the field oxides 14.

During manufacture, the field oxides 14 are first produced on a substrate 8, after which the gate oxides 10 are grown. A layer of polysilicon is laid over the oxides 10 and 14 which is then etched to the desired shapes, with the help of a shaped photoresist layer 15. The etching process typically involves placing a plasma 16 between the chip and a electrified plate 18 connected to a high voltage and electrically connecting a second electrified plate 20 to the substrate 8.

During etching, the edges of the polysilicon elements become exposed to the etching environment. Since the plasma 16 is ionized and since polysilicon is a conductive material, the polysilicon element 12 becomes charged. This is known as the "charging effect". The more charge the polysilicon element 12 attracts, the greater the voltage drop between the polysilicon element 12 attracts, the greater the voltage drop between the polysilicon element 12 and the substrate 8. If the voltage drop is high enough, it will induce Fowler-Nordhein (F-N) tunneling of charge from the substrate 8 to the polysilicon element 12, via the gate oxide 10. This indicated by the arrows 24. Since the field oxides 14 are quite thick, no F-N tunneling occurs through them. Unfortunately, F-N tunneling causes breakdown of the gate oxide 10, especially if the gate oxide 10 is quite thin, as is becoming increasingly common. It will be appreciated that, once the gate oxide 10 has broken down, the transistor will not function.

The extent of the F-N tunneling is a function of the size of the polysilicon element 12, of the area of the gate oxide 10 and of its thickness. As long as the area of polysilicon over the field oxides 14 is no larger than K times the area over the thin gate oxides 10 (where K varies according to the specific manufacturing process), the F-N tunneling will not occur. Alternatively, the total charge passing through the oxide will be small enough not to cause breakdown of the oxide. Chip designers are required to design their polysilicon elements accordingly, to minimize the amount of F-N tunneling by reducing the area of the field oxide relative to the area of the gate.

As long as the polysilicon etch is followed by a high temperature operation, the charge stored in the polysilicon due to the charging effect will be removed.

The polysilicon etch operation is not the only one which occurs in the presence of a plasma and which, accordingly, is affected by the charging effect, etching also occurs when creating metal lines, via connections and pads and all processes involving the removal of photoresist and plasma-based cleaning, For those processes which are not followed by high temperature processes, the charge accumulated therein is not removed. This is of particular concern for memory transistors which are designed to store charge and which, therefore, should not accumulate any charge until programmed to do so. Other sensitive devices, such as MOS transistors with thin gate oxides, must also be protected in other ways.

FIGS. 2A and 2B, to which reference is now made, illustrate an exemplary memory transistor in cross-sectional and layout views, respectively. The memory transistor includes gate oxide 10, polysilicon element 12, a source junction 30 and a drain junction 32. Junctions 30 and 32 are found on either side of polysilicon element 12. Connected to polysilicon element 12 and to junctions 30 and 32, via contacts 33, are metal lines 34. Protecting the remaining portions of polysilicon element 12 and the junctions 30 and 32 is an insulating layer 36. FIG. 2A also shows photoresist elements 35 which are used to pattern the metal lines 34. It is noted that, for clarity, FIG. 2B does not show photoresist elements 35. Also, for clarity and simplicity, FIG. 2B does not show all the details typical to memory and MOS transistors (like floating gates, etc.).

As mentioned hereinabove, the etching processes used for metal lines 34 and the etching process of photoresist elements 35 occur in the presence of a plasma and can potentially induce charge into polysilicon element 12. Like charge injected during programming, the induced charge causes F-N tunneling which results in breakdown of the gate oxide. This also reduces the yield FIGS. 3A, 3B and 3C, to which reference is now made, illustrate the solution in side cross-sectional, layout and circuit views, respectively. A metal line 40, which is connected to the polysilicon element 12, is laid down such that it is also connected, via a contact 42, to an n$^+$ area 44 which was previously embedded in the substrate 8. Since substrate 8 is a p-element, there is a p-n junction at the intersection of area 44 with substrate 8. In other words, metal line 40 is connected to a diode junction (the intersection of area 44 with substrate 8).

FIG. 3C shows the circuit of FIG. 3A. The memory transistor to be protected, formed of gate oxide 10 and polysilicon element 12, is labeled 46, and the diode junction is shown as a diode 48. The gate G of memory transistor 46 is connected to diode 48 via metal line 40.

If diode junction 48 is not fully covered by metal, it can become activated by the presence of light in the plasma. This produces a "photocurrent" which also pulls charge from polysilicon element 12. This mechanism is difficult to accurately control.

Unfortunately, diode junction 48 is always present in the chip, even though it is not necessary for the normal functioning of the chip. In fact, if it is not turned off during the nominal operation of the chip, it limits the voltage that can be applied to the protected node, metal line 40. Also , it drains an unwanted leakage current to ground, which might, in some applications be unacceptable. This diode cannot protect memory transistors since the latter are sensitive to lower voltages during plasma etching and the clamping voltage of the diode is too high for them.

SUMMARY OF THE INVENTION

An object of the present invention is to provide an alternative solution to the charging effect.

The present invention uses the charging effect to activate an n-channel or p-channel MOS protection transistor during the manufacturing process. The protection transistor is connected between a metal line and ground. During charging, the protection transistor discharges any accumulated charge on the metal line to ground. This controls the voltage level on the metal lines which, in turn, protects the sensitive devices which are connected to the metal line.

There is therefore provided, in accordance with a preferred embodiment of the present invention, a semiconductor chip including at least one sensitive device to be protected during manufacture against the charging effect, a metal line connected to the gate of the at least one sensitive device, a protection transistor and an antenna. The drain of the protection transistor is connected to the metal line and its source is connected to a ground supply via a first metal connection line. The antenna is formed from the same metal layer as the metal line and is connected to the gate of the protection transistor. The first connection line is formed from the same metal layer as the metal line.

Additionally, in accordance with a preferred embodiment of the present invention, the sensitive device is any one of the following: a memory transistor, a row of memory transistors, a plurality of rows of memory transistors, one or more n-channel transistors, one or more p-channel transistors and one or more capacitors.

Moreover, in accordance with a preferred embodiment of the present invention, the chip also includes a ring around the antenna which is connected to a drain of the protection transistor via the same metal layer as the metal line.

Further, in accordance with a preferred embodiment of the present invention, the chip also includes a ground connection between the antenna and the ground supply. The ground connection is formed of a different metal layer than the metal line.

Still further, in accordance with a preferred embodiment of the present invention, the protection transistor has a control line to its gate which is connected to other devices of the chip and wherein the control line is formed of a different metal layer than the metal line.

Additionally, in accordance with a preferred embodiment of the present invention, the chip also includes a second antenna formed of a different metal layer than the metal line.

Moreover, in accordance with a preferred embodiment of the present invention, a protection device which is activatable during the manufacturing process of a metal line having devices to be protected connected thereto and a ground supply. As described hereinabove, the antenna is formed of the same metal layer as the metal line and controls the operation of the protection transistor during the manufacturing process.

There is also provided, in accordance with a preferred embodiment of the present invention, a method of manufacturing a semiconductor chip. The method includes the steps of defining a protection transistor as one of the transistors of the chip which connects between a metal line and a ground supply, laying down a first metal layer and etching the first metal layer to create an antenna per protection transistor, at least one connection line from a drain of each protection transistor to the gates of a sensitive devices to be protected, and at least one connection line from a source of each protection transistor to the ground supply. The antenna is connectable to the gate of its protection transistor.

Additionally, in accordance with a preferred embodiment of the present invention, the step of etching also includes the step of etching a ring around each the antenna connected to the drain of its protection transistor.

BRIEF DESCRIPTION OF THE DRAWINGS

The present invention will be understood and appreciated more fully from the following detailed description taken in conjunction with the appended drawings in which.

DETAILED DESCRIPTION OF THE PREFERRED EMBODIMENT

The present invention provides a novel method for dealing with the charging problem which occurs during manufacturing of microelectronics devices. The present invention will be described using a memory transistor as the sensitive device to be protected; however, it will be appreciated that the present invention is applicable to all types of sensitive devices, such as memory transistors and capacitors. It can also be utilized for protecting devices which are not particularly sensitive, such as standard MOS devices (e.g. n-channel and/or p-channel transistors), if desired.

Figure 1:
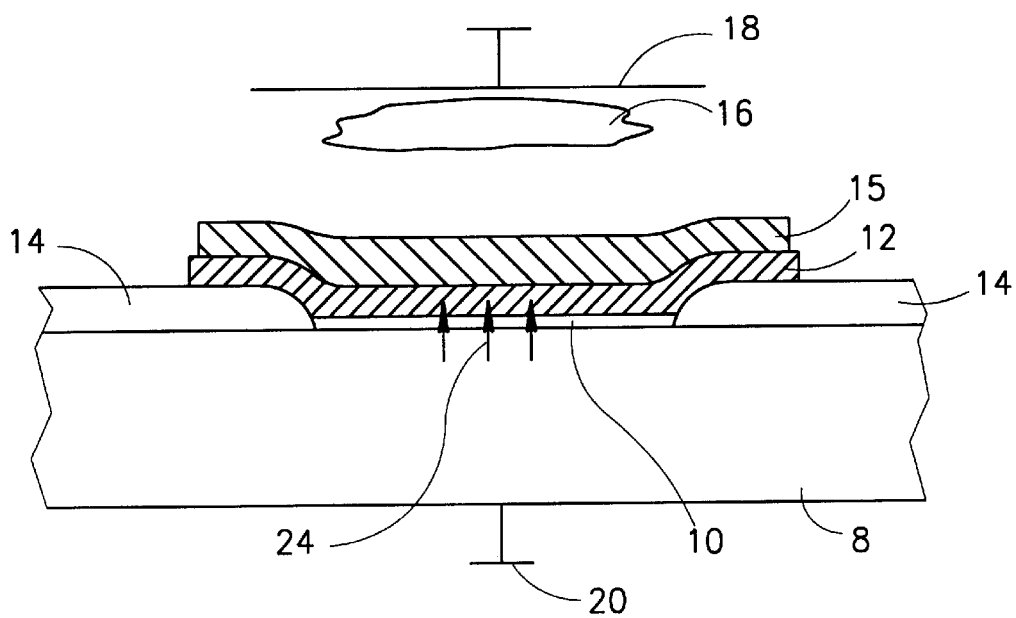
FIG. 1 is a schematic illustration of a prior art metal oxide semiconductor (MOS) transistor in a semiconductor chip during an etching operation.
Figure 2A:
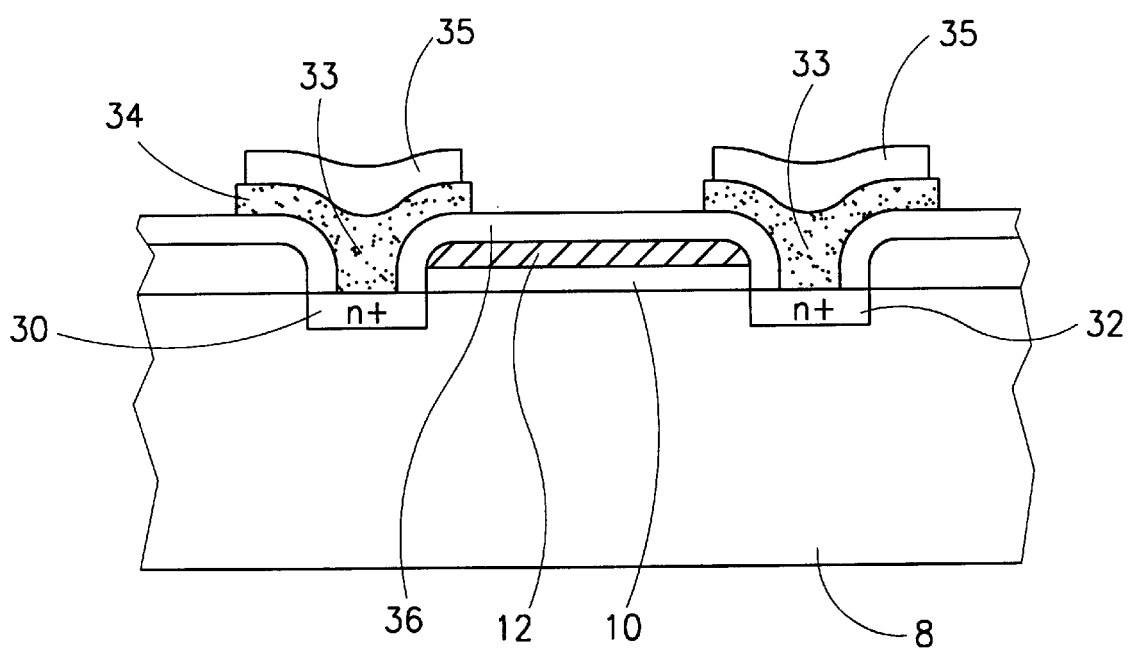
FIGS. 2A and 2B are cross-sectional and layout illustration, respectively, of a prior art memory transistor.
Figure 2B:
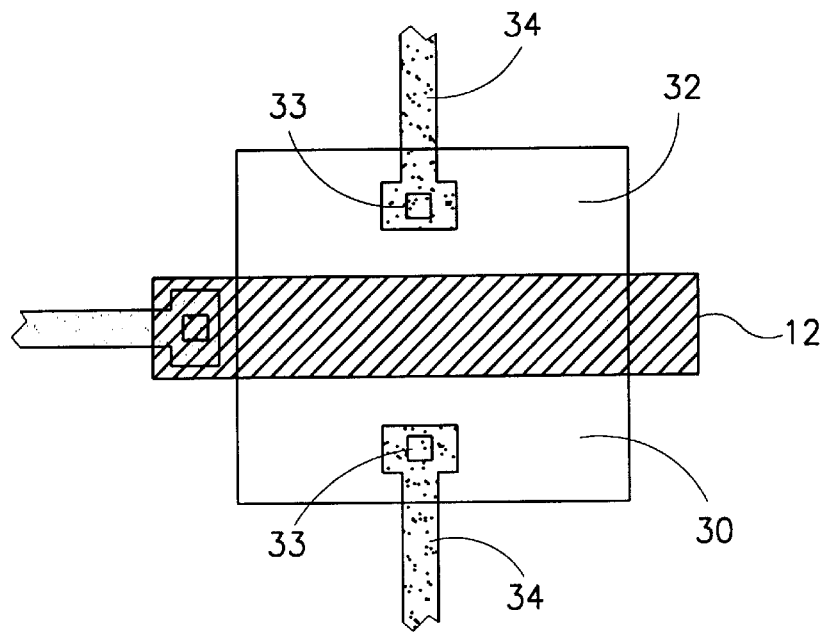
Figure 3A:
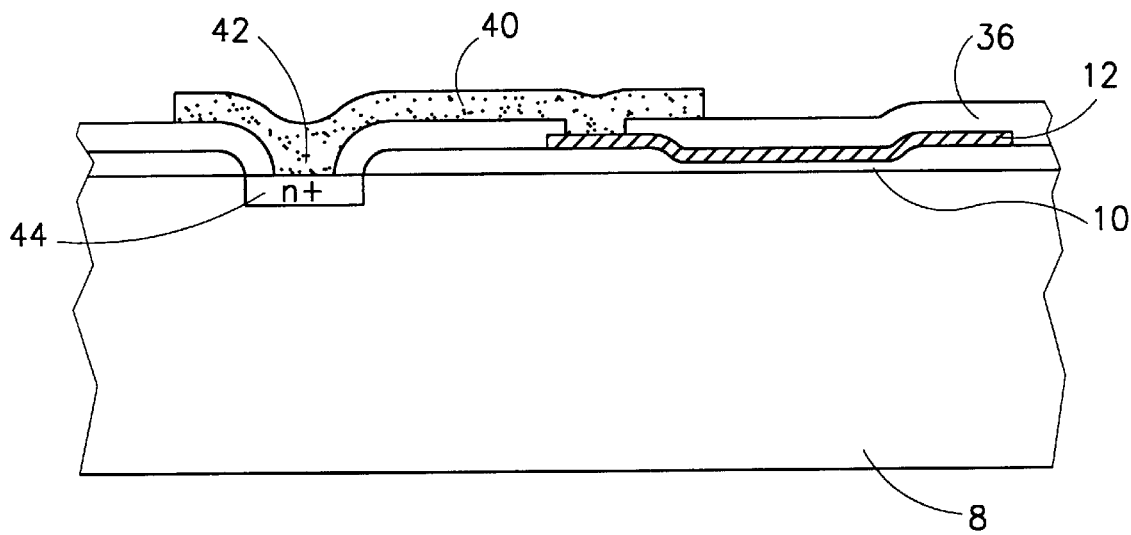
FIGS. 3A, 3B and 3C are side cross-sectional, layout and circuit illustrations, respectively, of a protection scheme for transistors being manufactured which utilizes a protection transistor, constructed and operative in accordance with a preferred embodiment of the present invention.
Figure 3B:
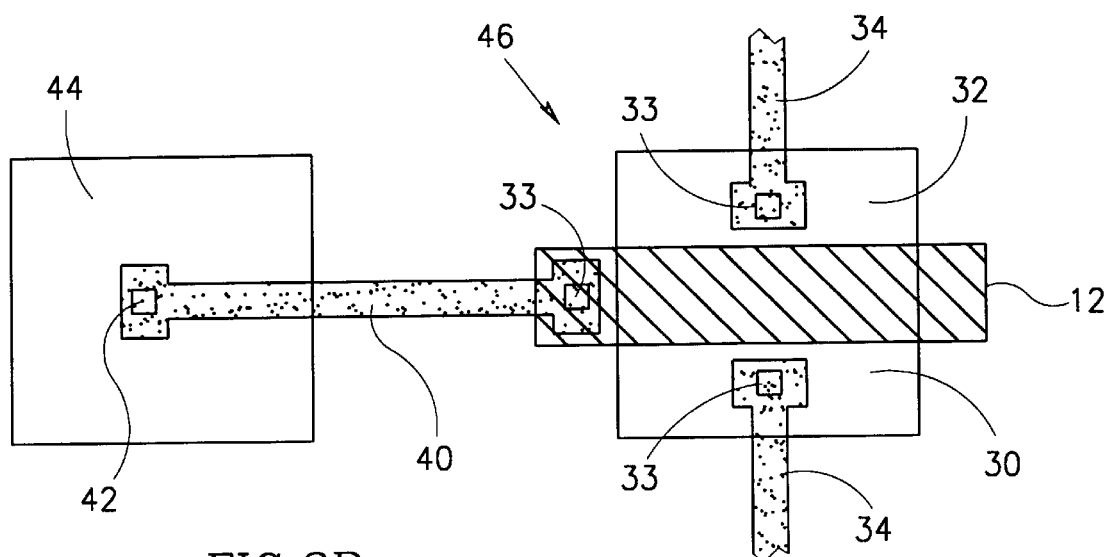
Figure 3C:
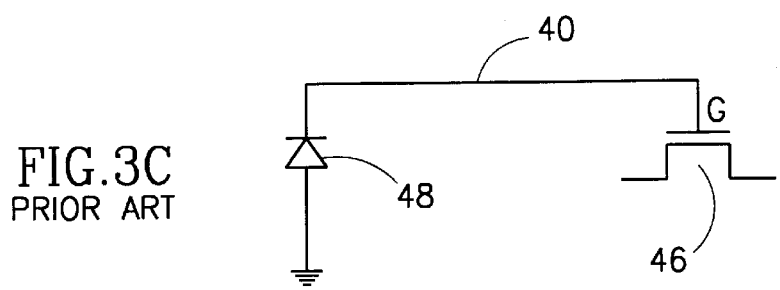
Figure 4A:
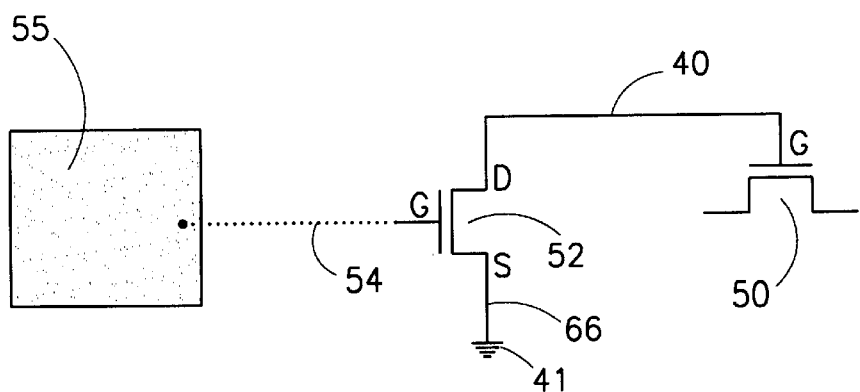
Figure 4B:
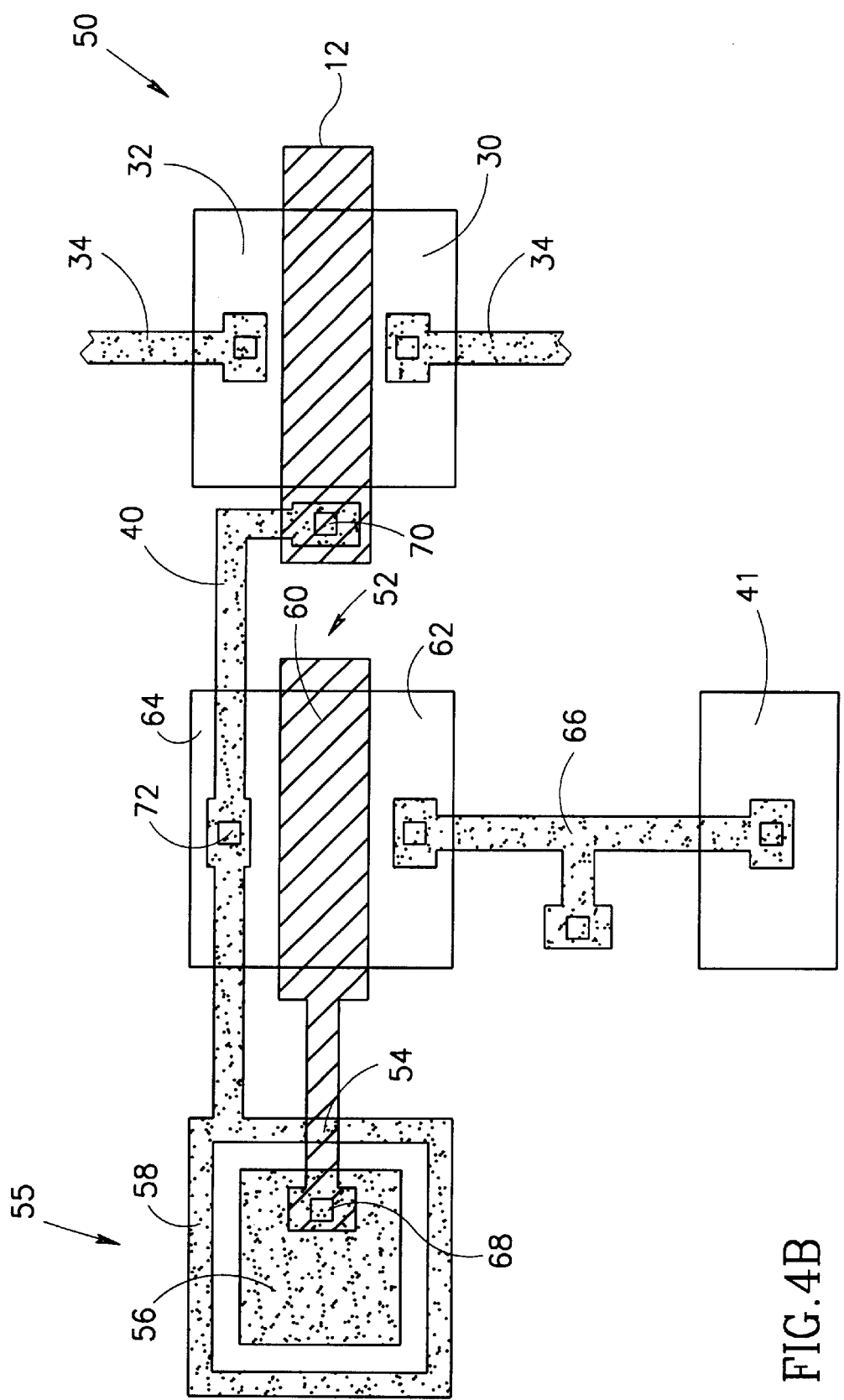

Reference is now made to FIGS. 4A and 4B which illustrate the concepts of the present invention. FIG. 4A is a partially circuit, partially layout illustration of a circuit, constructed and operative in accordance with a preferred embodiment of the present invention. FIG. 4B is an exemplary layout illustration of the circuit of FIG. 4A.

In the present invention and as shown in FIG. 4A, the sensitive device 50 to be protected, shown as a memory transistor, is connected, via metal line 40, to a protection transistor 52 which, in turn, is connected to ground 41 via a connection 66. Although shown herein as an n-channel transistor, it will be appreciated that protection transistor 52 can be any type of MOS or metal insulating semiconductor (MIS) device. For example, it can be an n-channel or a p-channel MOS transistor.

In accordance with a preferred embodiment of the present invention, the gate G of protection transistor 52 is controlled by a polysilicon line 54 (shown with a dotted line) which is connected to a metal antenna 55. Metal line 40, antenna 55 and connection 66 are formed from the same, first metal (metal 1) layer laid down on the chip.

During etching with plasma having positive charge, antenna 55 will collect charge. This creates a positive voltage at the gate G of protection transistor 52. At some point, this voltage will be higher than the threshold voltage of protection transistor 52 and protection transistor 52 will be activated as a result, thereby providing a current path from metal line 40 down to ground. Since metal line 40 is also connected to the polysilicon element (the "sensitive terminal" or gate G) of device 50 to be protected, the current path now opened will pull current from gate G of device 50.

It will be appreciated that protection transistor 52 does not need to be filly on. Since all that is needed is a current path to ground, it is sufficient just to turn protection transistor 52 slightly on. Thus, protection transistor 52 "clamps" the voltage on metal line 40 to at or slightly above the threshold voltage of protection transistor 52.

By activating protection transistor 52 during the metal process, antenna 55 ensures that the amount of charge collected in gate G of the device 50 never causes the voltage to rise above a level which causes Fowler-Nordheim tunneling.

If the plasma has a negative charge, the drain diode of protection transistor 52 acts as a forward biased diode that clamps metal line 40 to a very low voltage level, approximately −0.6 V, which prevents charging and damage.

If desired, and as shown in FIG. 4B, antenna 55 can be implemented as an inner metal inner antenna 56 surrounded by an outer metal ring 58. Drain D of protection transistor 52 is then connected to metal ring 58.

Ring 58, if included, ensures that, no matter how the etching process proceeds, metal line 40 remains grounded during the etching process. Initially, the metal layer is laid down over the entire chip and then it is etched to its desired shape. Features emerge during the etching process, but which feature emerges first varies.

While the metal layer is a single unit, the charging process is of no concern since the charge is distributed amoung many capacitive elements or the metal layer is grounded somewhere. If ring 58 and inner antenna 56 are separated together from the rest of the metal layer but remain connected to one another, then both the drain D and gate G of protection transistor 52, being connected to the same unit, will have the same voltage level and thus, protection transistor 52 will be turned on, since any transistor having no voltage drop from drain to gate is on, and metal line 40 will be shorted to ground.

If inner antenna 56 is etched from ring 58, but ring 58 is still connected to the rest of the metal layer, then drain D of protection transistor 52 and, accordingly, metal line 40, will be grounded through the rest of the metal layer. Once ring 58 is also separated from the rest of the metal alyer, inner antenna 56 will collect charge. This will activate protection transistor 52 and metal line 40 will be shorted to ground.

It will be appreciated that the present invention provides a mechanism to remove charge from gate G of device 50 to be protected, during the fabrication process.

FIG. 4B shows the present invention in layout view. As before, device 50 is formed of gate oxide 10 (not shown), polysilicon element 12 and neighboring junction 30 and 32. Somewhere else on the chip is protection transistor 52, formed of its own gate oxide (not shown), polysilicon element 60, source junction 62 and drain junction 64.

Source junction 62 is, in turn, connected to ground 41 (a $p^+$ area within a p type substrate 8 (not shown) or an $n^+$ area within an n type substrate) via a metal line 66, formed from the same metal 1 layer as metal line 40, inner antenna 56 and ring 58. The use of a local contact to ground through the metal 1 layer ensures that, during etching of metal 1, the protection scheme is functional. Polysilicon element 60 of protection transistor 52 is connected to inner antenna 56 through a contact 68 while polysilicon element 12 of the device 50 is connected to ring 58 via metal line 40, through a contact 70. Metal line 40 is also connected to drain junction 60 through a contact 72.

Since metal line 40 is connected to both the polysilicon element 12 of device 50 to be protected and to drain junction 64 of protection transistor 52, when protection transistor 52 is activated, it will transfer the charge on polysilicon element 12 to ground 41.

It will be appreciated that the protection transistor of the present invention provides protection to all types of sensitive devices, whether they be memory transistors, n-channel transistors, p-channel transistors or capacitors.

It will be appreciated that the present invention can also be implemented using local interconnected technology.

Typically, there is more than one metal layer in each chip. Each metal layer is separated from the others by an insulation layer. Thus, over the metal 1 layer shown hereinabove, there is an insulating layer followed by a second, metal 2 layer. Electrical connection between metal 1 and metal 2 are made using via connections.

Figure 5A:
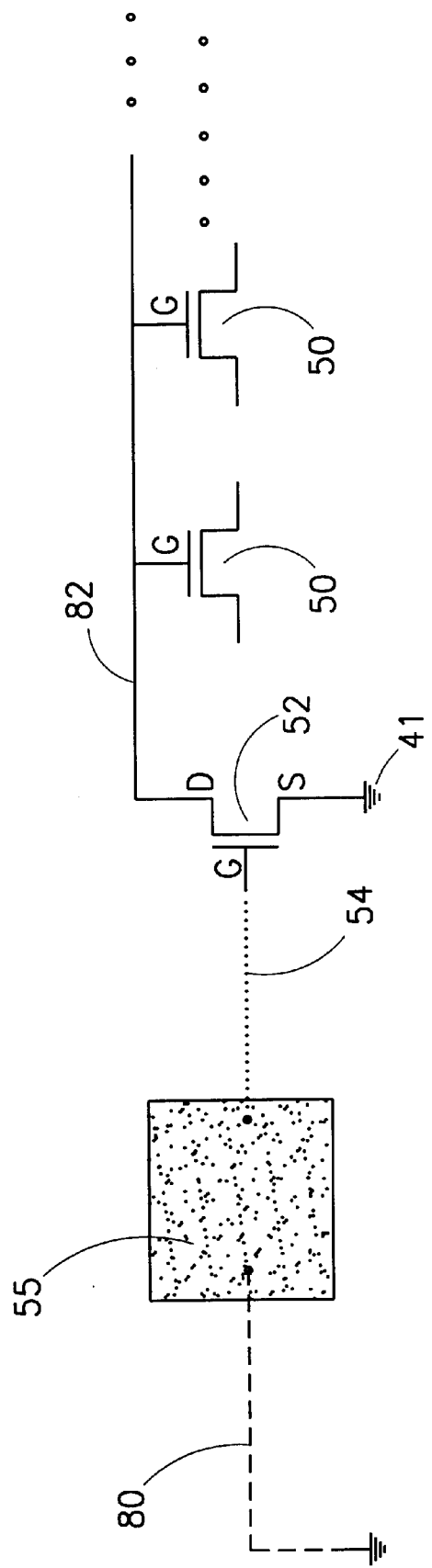
FIGS. 5A and 5B are partially circuit, partially layout and full layout illustrations, respectively, of the circuit of FIGS. 4A and 4B with a second metal layer thereon.
Figure 5B:
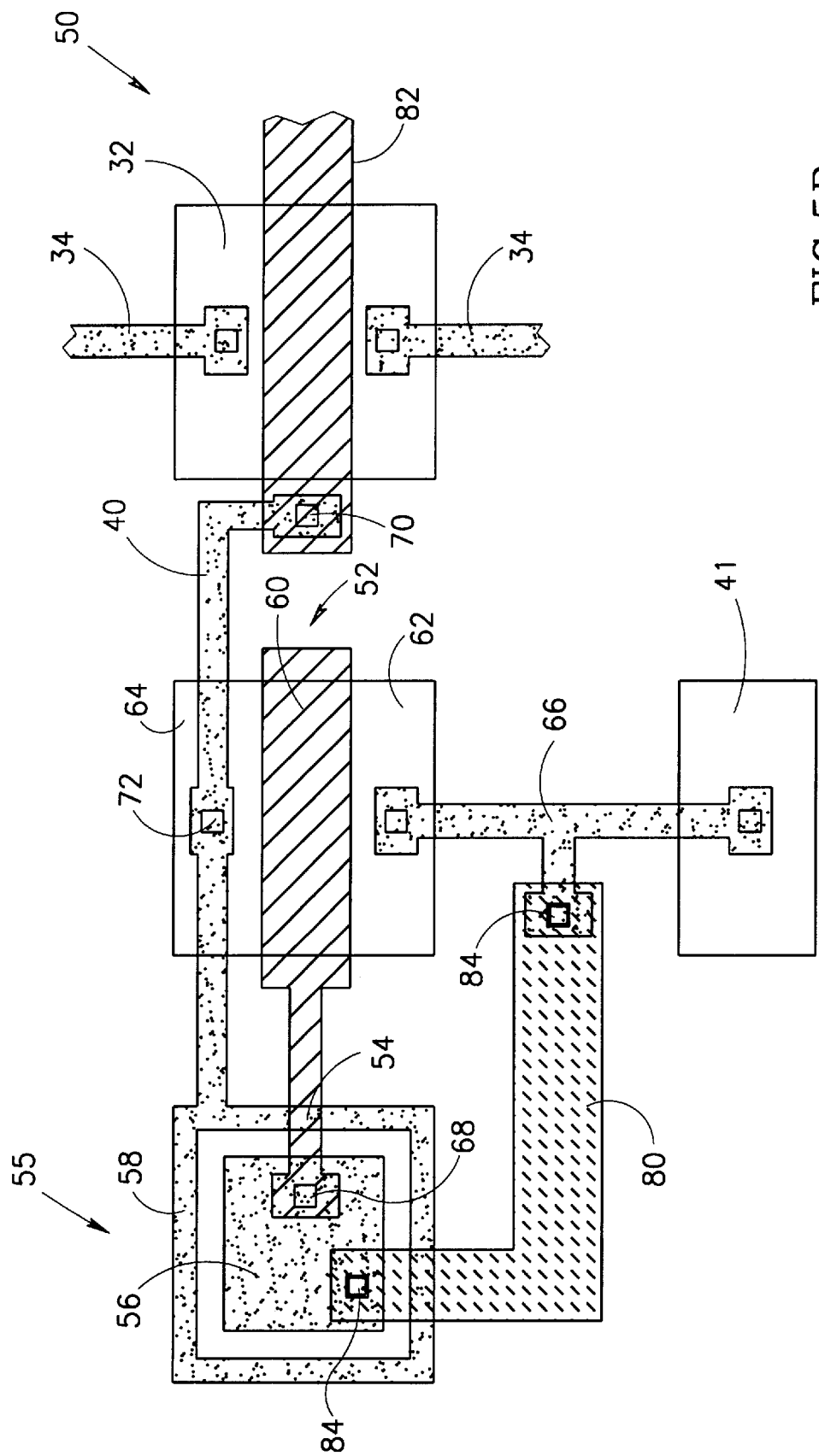

Reference is now made to FIGS. 5A and 5B which illustrate the addition of a metal 2 line (marked with dashed lines and labeled 80), to the circuit of FIGS. 4A and 4B, respectively. Similar reference numerals refer to similar elements. Once again, FIG. 5A shows antenna 55 while FIG. 5B shows its implementation as inner antenna 56 and outer ring 58.

FIG. 5A indicates that a plurality of devices 50, forming one row of a two dimensional matrix of memory transistors and connected together via a word line 82 made of polysilicon or metal 1, can be protected by protection transistor 52. FIG. 5B shows that word line 82 acts both as a word line and as the individual gates (polysilicon 12) of devices 50.

As can be seen in FIG. 5A metal 2 line 80 connects antenna 55 to ground. This is achieved, as shown in FIG. 5B, by connecting metal 2 line 80 both to the inner antenna 56 and to metal line 66 which, in turn, is connected to ground 41. It is noted that metal 2 line 80 is connected to inner antenna 56 and metal line 66 through via connection 84.

The process of etching layer 80 does not cause word line 82 or metal line 40 to collect charge since both the word lines and metal 1 are now covered by an insulating layer (not shown) and are not directly connected to metal 2 line 80.

It will be appreciated that, by connected antenna 55 to ground with metal 2 line 80, the present invention ensures that protection transistor 52 is not active during the active lifetime of the chip. Rather, protection transistor 52 is only active during the etching process of the metal 1 layer, when metal 2 layer has not yet been applied.

It will further be appreciated that, as long as the metal 1 layer, rather than the metal 2 layer, is used to connect all of the polysilicon elements 12 and as the connecting metal around the protection transistor 52, the charging effect can be controlled. The metal 2 layer should not be utilized for these purposes.

Figure 6:
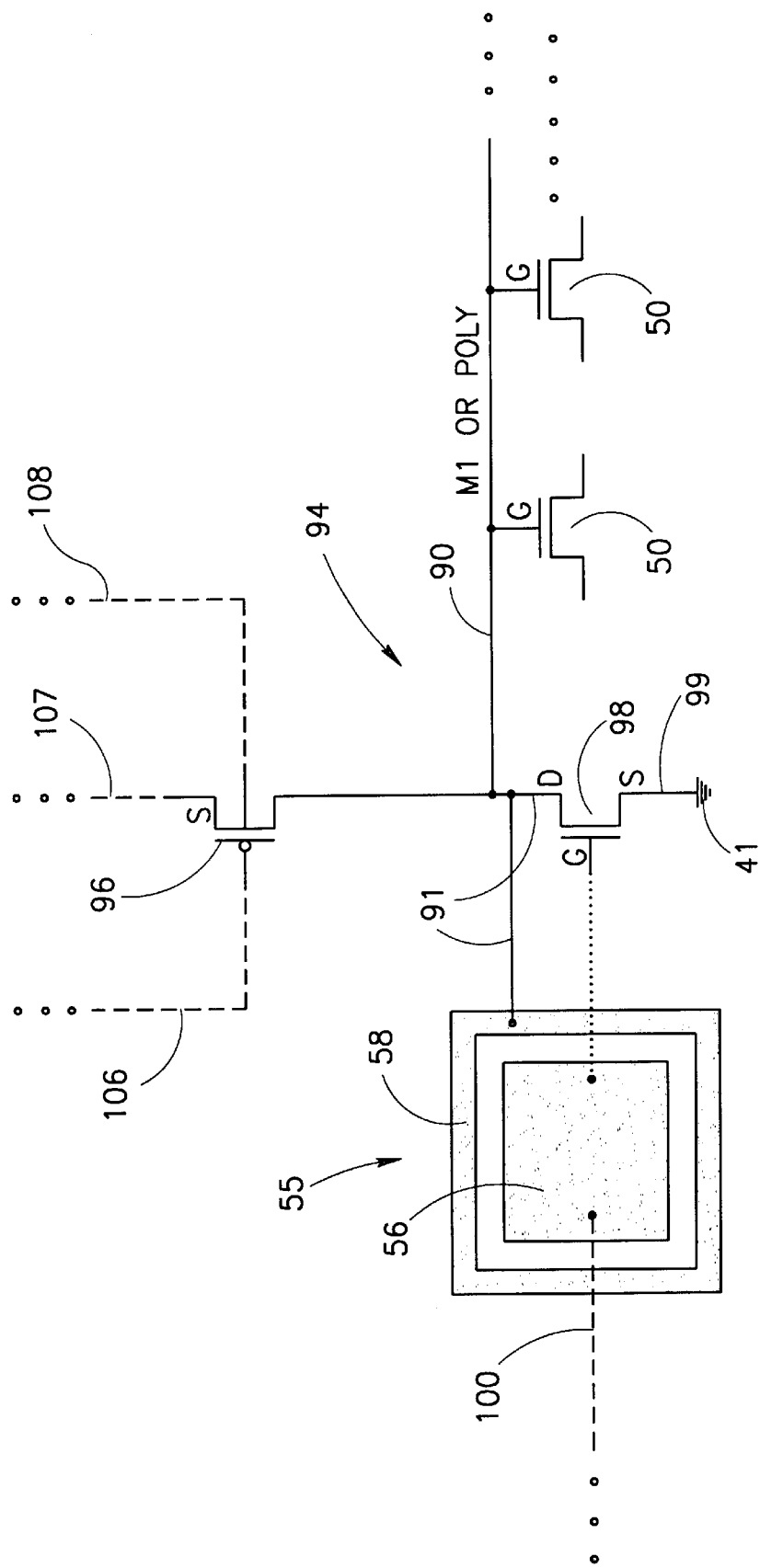
FIG. 6 is a partially circuit, partially layout illustration of an alternative embodiment of the present invention, in which an n-channel MOS transistor which is part of the original design of the chip is used to provide protection during manufacture.

As shown in FIG. 5A, the present invention requires an additional protection transistor 52 per word line. However, existing designs often includes transistors which can be utilized as protection transistors during manufacture and as active transistors during operation of the chip. An example of this is shown in FIG. 6, to which reference is now made and in which similar reference numerals refer to similar elements from previous embodiments. In FIG. 6, antenna 55 is shown formed of inner antenna 56 and outer ring 55.

FIG. 6 shows a structure which is common in memory arrays. Each word line 90 has its own word line is accessed. To each word line are connected a plurality of devices 50.

Word line drivers can have many forms though most, if not all of them, have an n-channel transistor connected between the word line and ground. Thus, word line driver 94 is shown formed of a p-channel transistor, pull-up transistor 96 and an n-channel, pull-down transistor 98.

Since the word line 90 is connected to the gates G of the devices 50, word line 90 must pull the charge away from the gates G. Thus, in accordance with a preferred embodiment of the present invention, word line 90 must be formed either from polysilicon or from the metal 1 layer (shown in solid lines). Furthermore, since pull-down transistor 98 is connected between the word line 90 and ground, it can function as the protection transistor during manufacture. Accordingly, its connection to ground, labeled 99, must be formed from the metal 1 layer and its gate G and drain D must be connected to inner antenna 56 and ring 58, respectively, also formed from the metal 1 layer. Furthermore, the connection 91 from word line 90 to ring 58 and pull-down transistor 98 must also be of metal 1.

With the arrangement shown in FIG. 6, antenna 55 will attract charge during the metal 1 etching process and will activate pull-down transistor 98 to discharge word line 90.

Since pull-down transistor 98 must operate during the operation of the chip, the metal 2 layer must not connected inner antenna 56 to ground, as in the previous embodiment. Instead, a metal 2 line 100 connects inner antenna 56 to whatever voltage signal is desired for its use, during regular operation of the chip, as part of the word line driver 94.

The remaining signals needed for word line driver 94 are provided with metal 2 lines and not with metal 1 lines. Thus, the following lines are formed of metal 2: a line 106 controlling the gate G of pull-up transistor 96 and a line 108 provided power to the n-well of pull-up transistor 96. Since these metal 2 connections are not present during the etching of the metal 1 layer, transistor 96 is not active during the metal 1 etching.

Figure 7:
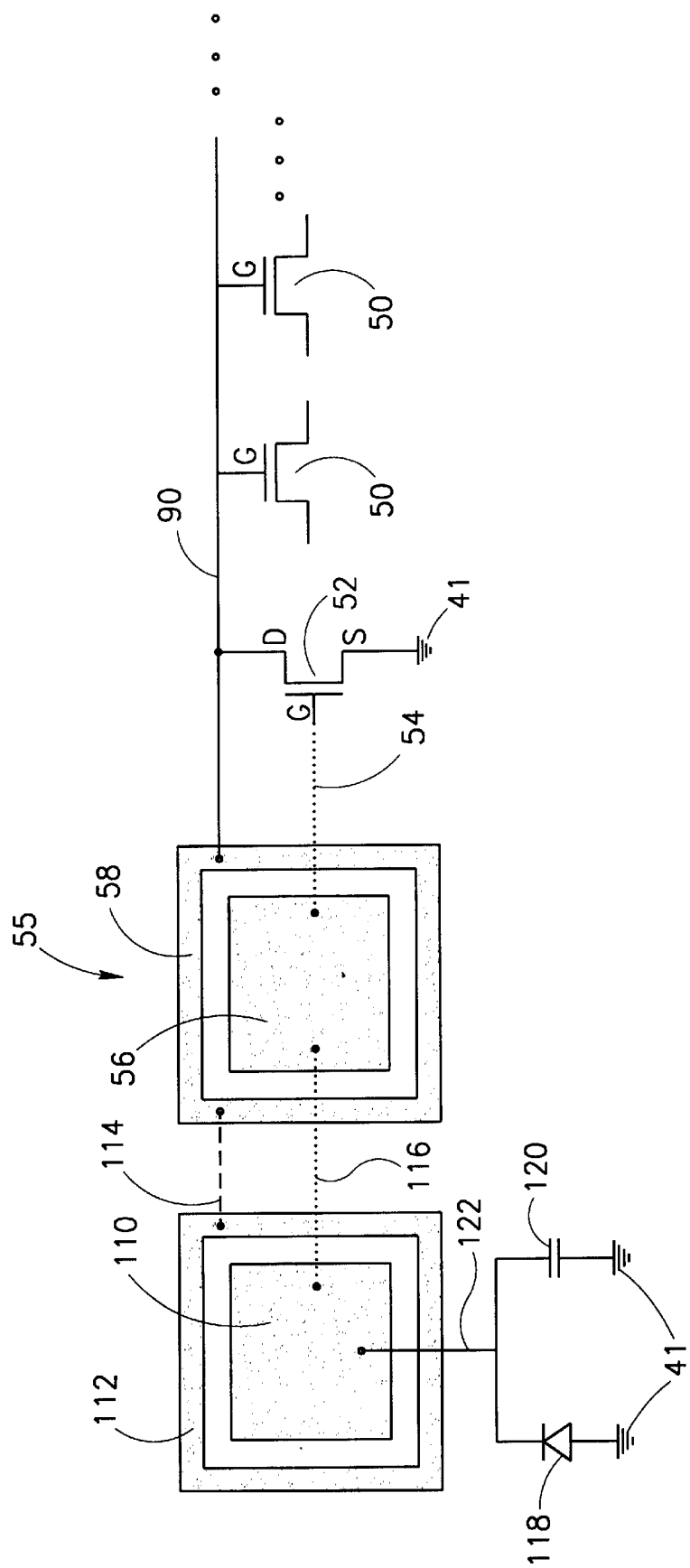
FIG. 7 is a partially circuit, partially layout illustration of a further alternative embodiment of the present invention in which the second metal layer also includes an antenna.

Reference is now made to FIG. 7 which illustrates an alternative embodiment of the present invention in which the metal 2 layer also has an inner antenna 110 and outer ring 112. In this case, the circuit protects word line 90 from charging during metal 2 etching as well as during metal 1 etching. Similar reference numerals refer to similar elements from previous embodiments.

In this embodiment, metal 2 ring 112 is connected to metal 1 ring 58 via a metal 2 line 114 and metal 2 antenna 110 is connected to metal 1 antenna 56 via a polysilicon line 116. Furthermore, metal 2 antenna 110 is connected to ground 41 through both a diode 118 and a capacitor 120. Metal 2 antenna 110 is connected to diode 118 and capacitor 120 via a metal 1 line 122.

Metal 2 antenna 110 and ring 112 provide the same activation to protection transistor 52 as do metal 1 antenna 56 and ring 58, only the metal 2 antenna and ring do so during etching of the metal 2 layer.

Diode 118 and capacitor 120 ensure that gate G of the protection transistor 52 is not directly connected to ground when metal 2 antenna 110 and ring 112 are etched. Rather, during etching of the metal 2 layer, diode 118 is a reverse biased diode which leaks a very small current. Thus, metal 2 antenna 110 successfully activates protection transistor 52 despite the leaked current. After fabrication is finished, metal 2 antenna 110 is not active but diode 118 continues to leak charge. This slowly drains line 54 and 116, eventually turning off protection transistor 52, after which the chip is ready for use.

Capacitor 120 ensures that any voltage spikes or jumps that might occur on word line 90 or at the drain of protection transistor 52 during regular operation of the chip do not, due to capacitance paths between the drain and gate of protection transistor 52, accidentally turn on protection transistor 52.

The embodiments of FIGS. 6 and 7 have one protection transistor 52 and antenna 55 for each word line, to which a multiplicity of memory cells are connected. However, these embodiments require as many antennas 56 as there are word lines, which is expensive in terms of chip area.

Figure 8A:
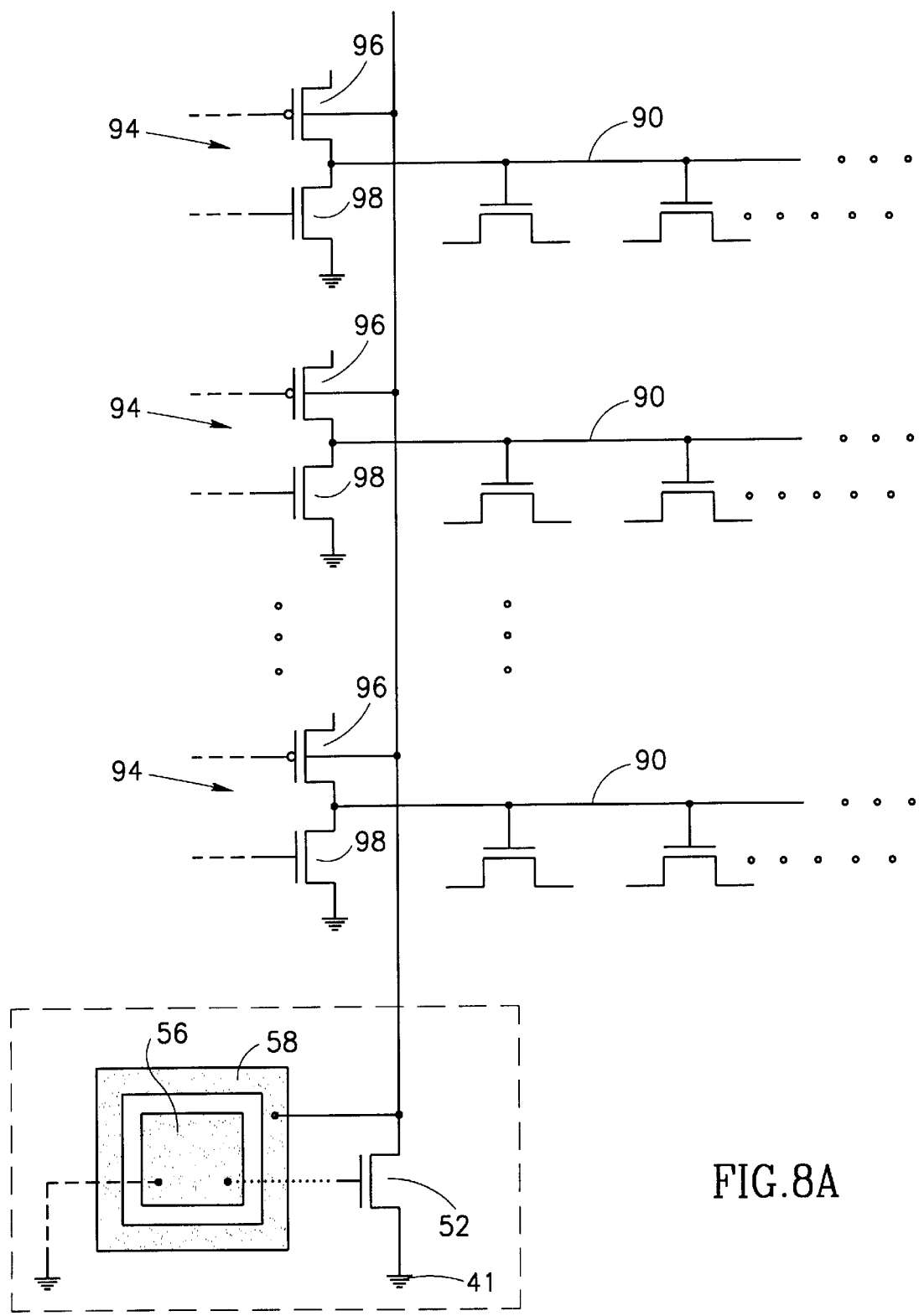
FIG. 8A is a partially circuit, partially layout illustration of a protection circuit for a multiplicity of word lines.
Figure 8B:
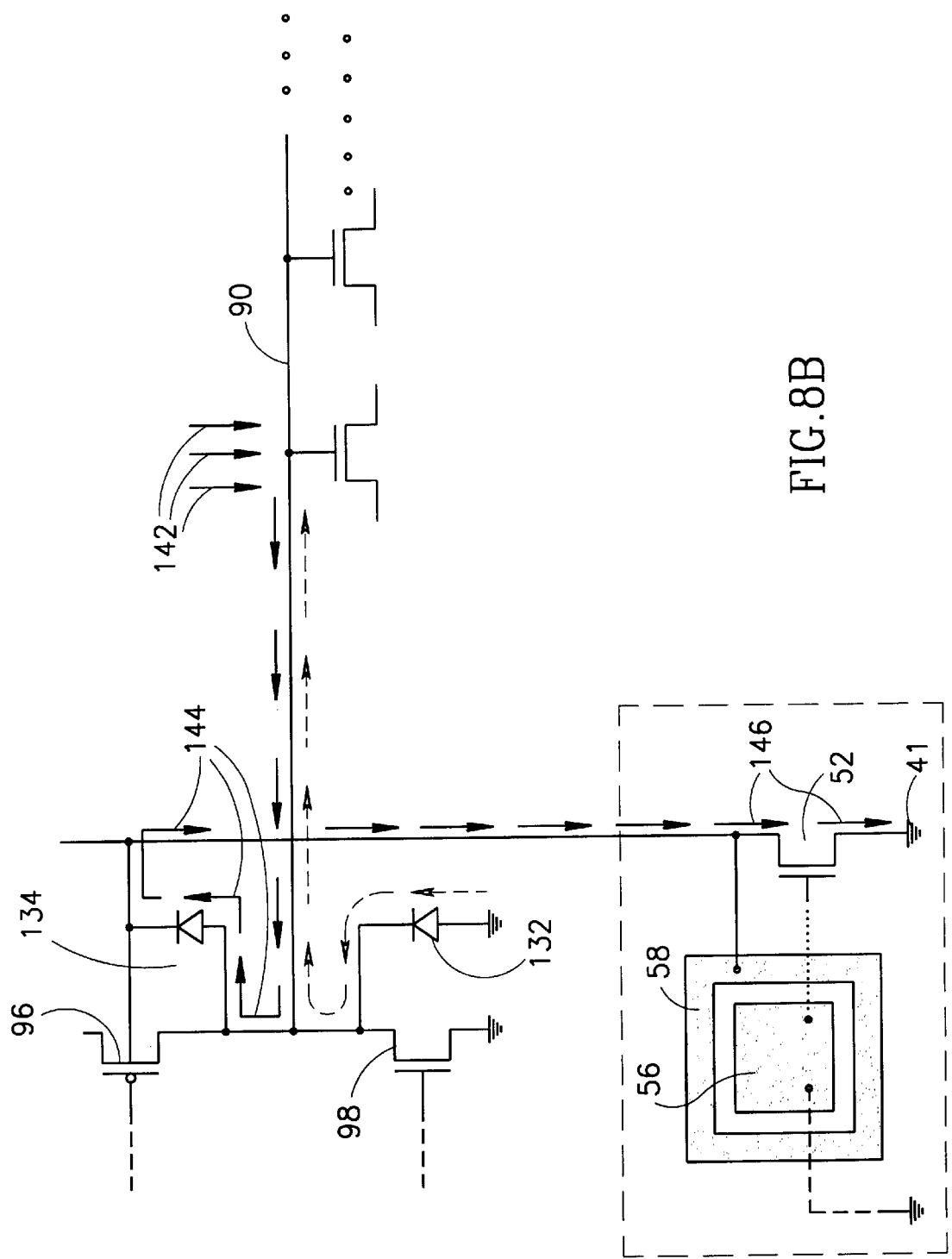
FIG. 8B is a partially circuit, partially layout illustration of the drain path for accumulated charge in a portion of the circuit of FIG. 8A.
Figure 8C:
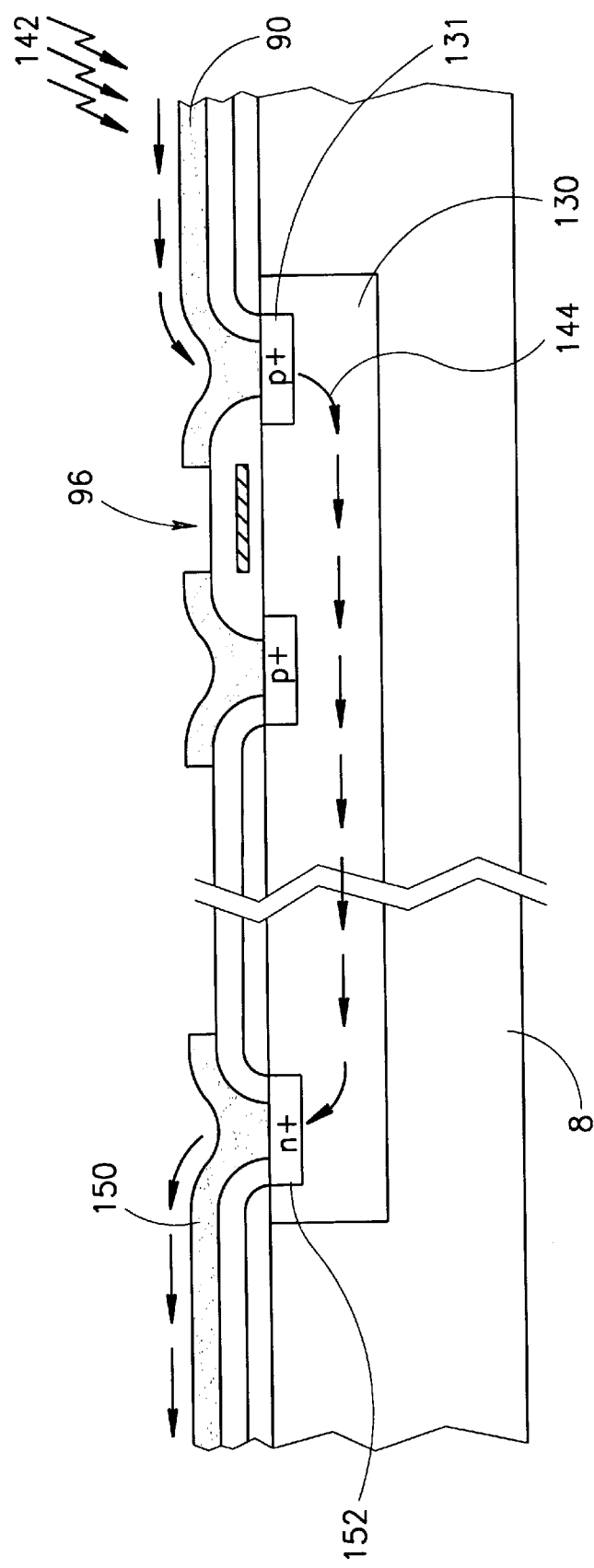
FIG. 8C is a cross-sectional illustration of a portion of the circuit of FIG. 8B.

Reference is now made to FIGS. 8A, 8B and 8C which illustrate a further embodiment of the present invention which provides a single protection transistor 52 and antenna 55 for a plurality of word lines 90. Similar reference numerals refer to similar elements from previous embodiments and antenna 55 is shown formed of inner antenna 56 and outer ring 55. FIG. 8A shows the circuit, FIG. 8B shows the current flow during positive and negative charging for a portion of the circuit and FIG. 8C shows the cross-section for the portion shown in FIG. 8B.

Each word line 90 is controlled by its word line driver 94 and each word line driver 94 includes p-channel transistor 96 and n-channel transistor 98. As is known in the art, each p-channel transistor 96 is built in an n-well 130 to which a power supply is connected to ensure that n-well 130 is maintained at the highest positive voltage supplied during normal operation of the chip.

Applicants have realized that the drains of the p-channel transistors 96 are formed of p$^+$ material 131 (FIG. 8C) set into the n-well 130, forming a p-n junction. As is known in the art, a p-n junction is a diode, labeled 134 in FIG. 8B.

Furthermore, applicants have realized that, typically, the p-channel transistors 96 are all built on the same n-well 130 and thus, the diodes 134 are connected together. Finally, it is noted that the drains of the n-channel transistors 98 are of n+ material set into the p-material of substrate 8 (not shown), which forms another diode 132.

FIG. 8A therefore, shows a single protection transistor 52, with its associated inner antenna 56 and ring 58, connected to the n-well 130. As mentioned hereinabove, each p-channel transistor 96 is connected to one of the word lines 90 and to n-well 130. Therefore, since protection transistor 52 is connected to n-well 130 single protection transistor 52 protects all of the word lines 90.

FIGS. 8B and 8C illustrate the current flow during etching or some other charging process. Word line 90, formed of polysilicon or metal 1, gathers positive charge, as indicated by arrows 142. Since the voltage is higher at the drain of p-channel transistor 96 than at n-well 130, diode 134 acts as a forward biased diode and transfers charge from p+ ea 131 to n-well 130, as indicated by arrows 144. Since the etching process also causes charging of antenna 55, protection transistor 52 is activated and passes the charge accumulating in n-well 130 to ground 41, as indicated by arrows 146. FIG. 8C shows a metal 1 line 150, connected to n-well 130 through an n+ area 152, which carries the charge from n-well 130 to protection transistor 52. This movement of charge is true for each word line 90 and its p-channel transistor 96.

It is noted that, if the charge is a negative charge, current flows from ground through diode 132 of n-channel transistor to the word line as indicated by the dotted lines and causes the discharge of the negative charge accumulated thereon. It further clamps the voltage to approximately −0.7 V.

It will be appreciated by persons skilled in the art that the present invention is not limited by what has been particularly shown and described herein above. For example, the protection transistor can be a—channel transistor and the substrate can be an n+ substrate. Rather the scope of the invention is defined by the claims that follows:

What is claimed:

1. A method of manufacturing a semiconductor chip, the method comprising:

defining a protection transistor as the transistor of the chip which connects a terminal of a sensitive device to ground;

connecting a gate of said protection transistor to a first portion of an antenna; and connecting a second terminal of said protection transistor to a second portion of said antenna;

wherein, during at least one plasma-based process, said first and second portions of said antenna are separated from one another, such that said transistor remains conducting during some portion of the at least one plasma based process.

2. The method according to claim 1, wherein the first portion of said antenna is an inner antenna connected to the gate of said protection transistor and said second portion is an outer ring around said inner antenna.

3. The method according to claim 1, wherein prior to the separation of the first and second portions of said antenna, the gate and second terminal of said transistor are electrically connected such that they are at approximately the same voltage.

4. The method according to claim 3, wherein said transistor is active and conducts current.

5. The method according to claim 1, wherein after the separation of the first and second portions of said antenna, electric charge buildup on the first portion of said antenna raises the voltage of the gate of said protection transistor and causes said protection transistor to conduct electric current.

6. A protection circuit comprising:

an antenna formed of a first portion and a second portion;

a protection transistor connecting a terminal of a sensitive device to ground, said transistor having a gate and a second terminal, wherein the gate of said protection transistor is connected to said first portion of said antenna and wherein the second terminal of said protection transistor is connected to the second portion of said antenna; and wherein during at least one plasma-based process, the first and second portions of said antenna are separated from one another, such that said transistor remains conducting during some portion of the at least one plasma based process.

7. The protection circuit according to claim 6, wherein the first portion of said antenna is an inner antenna connected to the gate of said protection transistor and said second portion is an outer ring around said inner antenna.

8. The procetection circuit according to claim 6, wherein prior to the separation of the first and second portions of said antenna, the gate and second terminal of said transistor are electrically connected such that they are at approximately the same voltage.

9. The protection circuit according to claim 6, wherein after the separation of the first and second portions of said antenna, electric charge buildup on the first portion of said antenna raises the voltage of the gate of said protection transistor and causes said protection transistor to conduct current.

* * * * *